(12) United States Patent
Miyazawa

(10) Patent No.: US 6,885,029 B2
(45) Date of Patent: Apr. 26, 2005

(54) SYSTEM AND METHODS FOR DRIVING AN ELECTRO-OPTICAL DEVICE

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/621,610

(22) Filed: Jul. 18, 2003

(65) Prior Publication Data

US 2004/0026723 A1 Feb. 12, 2004

(30) Foreign Application Priority Data

Jul. 31, 2002 (JP) ........................................ 2002-223160
Jul. 16, 2003 (JP) ........................................ 2003-198129

(51) Int. Cl.$^7$ ........................ H01L 29/04; H01L 31/036
(52) U.S. Cl. ............................ 257/59; 257/72; 345/82; 345/205
(58) Field of Search ....................... 257/59, 72; 345/82, 345/205

(56) References Cited

U.S. PATENT DOCUMENTS 6,229,506 B1 * 5/2001 Dawson et al. ............... 345/82
6,522,315 B1   2/2003 Ozawa et al. ................ 345/92
2003/0011584 A1 * 1/2003 Azami et al. ............... 345/204

FOREIGN PATENT DOCUMENTS

JP      WO98/36407        8/1998

* cited by examiner

*Primary Examiner*—David Nelms
*Assistant Examiner*—Tu-Tu Ho
(74) *Attorney, Agent, or Firm*—Oliff & Berridge, PLC

(57) ABSTRACT

The invention provides an electronic circuit, a driving method for an electronic circuit, an electro-optical device, a driving method for an electro-optical device, and an electronic apparatus which can reduce the dispersion of the threshold voltages of transistors. A driving transistor, first and second switching transistors, an adjustment transistor, a coupling capacitor, and a holding capacitor form a pixel circuit. The threshold voltage of the adjustment transistor is applied to the gate of the driving transistor. According to the present invention, the luminance gradation of a display element, such as an organic EL element, can be precisely controlled according to a data voltage.

23 Claims, 5 Drawing Sheets

SYSTEM AND METHODS FOR DRIVING AN ELECTRO-OPTICAL DEVICE

BACKGROUND OF THE INVENTION

1. Field of Invention

The present invention relates to electronic circuits, driving methods for electronic circuits, electro-optical devices, driving methods for electro-optical devices, and electronic apparatus.

2. Description of Related Art

An active-matrix driving method is one of driving methods for electro-optical devices having electro-optical elements, such as liquid-crystal elements, organic EL elements, electro-phoresis elements, and electron-emission elements. In electro-optical devices which use the active-matrix driving method, a plurality of pixel circuits are disposed in a matrix manner in a display panel section. Each of the plurality of pixel circuits can include an electro-optical element and a driving transistor for supplying driving power to the electro-optical element.

Among those elements, since current-driven elements, as described in International Publication No. WO98/36407, driven by current, such as organic EL elements, have luminance which depends on the current level, it is necessary to drive their pixel circuits precisely.

Since the plurality of pixel circuits have dispersion in characteristics, such as the threshold voltages of the driving transistors, even when data signals corresponding to the same gradation are sent, the luminance of the electro-optical elements differs at the plurality of pixels. Especially when thin-film transistors are used as the driving transistors, a desired display quality may not be obtained because the thin-film transistors have much dispersion in their threshold voltages.

SUMMARY OF THE INVENTION

The present invention has been made to solve at least the above-described problems. An object of the present invention is to provide an electronic circuit, a driving method for an electronic circuit, an electro-optical device, a driving method for an electro-optical device, and an electronic apparatus which can reduce dispersion in the threshold voltages of transistors.

An electronic circuit according to the present invention can include a first transistor including a first terminal, a second terminal, and a first control terminal, a second transistor including a third terminal, a fourth terminal, and a second control terminal, the third terminal being connected to the first control terminal, a capacitive element including a first electrode and a second electrode, the first electrode being connected to the first control terminal, and a third transistor including a fifth terminal and a sixth terminal, the fifth terminal being connected to the second electrode, and the second control terminal is connected to the third terminal. With this, the electronic circuit compensates the threshold voltage of the first transistor for a change caused by manufacturing dispersion.

This electronic circuit can also include a fourth transistor including a seventh terminal and an eighth terminal, the seventh terminal being connected to the fourth terminal of the second transistor. With this, the conduction state of the fourth transistor can be controlled to set the potential of the first control terminal to a desired potential and to maintain it.

In the electronic circuit, the first terminal may be connected to an electronic element. In the electronic circuit, the electronic element may be, for example, a current-driven element.

An electronic circuit according to the present invention can include a plurality of first signal lines, a plurality of second signal lines, a plurality of power lines, and a plurality of unit circuits. Each of the plurality of unit circuits can include a first transistor including a first terminal, a second terminal, and a first control terminal. The electronic circuit can also include a second transistor including a third terminal, a fourth terminal, and a second control terminal, the third terminal being connected to the first control terminal. The circuit can include a capacitive element including a first electrode and a second electrode, the first electrode being connected to the first control terminal, and a third transistor including a fifth terminal, a sixth terminal, and a third control terminal, the fifth terminal being connected to the second electrode, the second control terminal is connected to the third terminal, and the third control terminal is connected to one of the plurality of first signal lines. With this, the electronic circuit can compensate the threshold voltage of the first transistor for a change caused by manufacturing dispersion.

The electronic circuit can also include a fourth transistor including a seventh terminal, an eighth terminal, and a fourth control terminal, the seventh terminal being connected to the fourth terminal, and the fourth control terminal being connected to one of the plurality of second signal lines. With this, the conduction state of the fourth transistor can be controlled to set the potential of the first control terminal to a desired potential and to maintain it.

In the electronic circuit, the first terminal may be connected to an electronic element.

In the electronic circuit, the electronic element may be, for example, a current-driven element.

An electronic circuit according to the present invention can include a holding element for holding a signal as a charge; a first switching transistor for controlling the transfer of the signal to the holding element; a driving transistor of which the conduction state is set according to the charge held by the holding element; and an adjustment transistor for setting a control terminal of the driving transistor to a predetermined potential prior to the transfer of the signal to the holding element.

With this, the electronic circuit can compensate the threshold voltage of the driving transistor by on/off control of the first switching transistor.

It is preferred that the electronic circuit include a second switching transistor for controlling the electronic connection or the electronic disconnection between the adjustment transistor and the predetermined potential.

In the electronic circuit, the driving transistor may be connected to an electronic element.

In the electronic circuit, the electronic element may be, for example, a current-driven element.

A driving method for an electronic circuit according to the present invention is a driving method for an electronic circuit which includes a first transistor including a first terminal, a second terminal, and a first control terminal, a second transistor including a third terminal and a fourth terminal, the third terminal being connected to the first control terminal, and a capacitive element including a first electrode and a second electrode, the first electrode being connected to the first control terminal, and the driving method includes a first step of electronically connecting the fourth terminal to a predetermined potential and of setting the first control terminal to a first potential, and a second step of, when the fourth terminal is electronically disconnected from the predetermined potential, changing the potential of the second electrode of the capacitive element from a second potential to a third potential to change the potential of the first control terminal from the first potential.

With this, the electronic circuit which compensates the threshold voltage of the first transistor for a change caused by manufacturing dispersion is driven.

It is preferred in the driving method for the electronic circuit that the first step be performed when the potential of the second electrode is set to the second potential.

An electro-optical device according to the present invention can include a plurality of scanning lines, a plurality of data lines, a plurality of power lines, and a plurality of unit circuits having electro-optical elements, each of the plurality of unit circuits includes a first transistor including a first terminal, a second terminal, and a first control terminal; an electro-optical element connected to the first terminal, a second transistor including a third terminal, a fourth terminal, and a second control terminal, the third terminal being connected to the first control terminal, a capacitive element including a first electrode and a second electrode, the first electrode being connected to the first control terminal, a third transistor including a fifth terminal, a sixth terminal, and a third control terminal, the fifth terminal being connected to the second electrode; and a fourth transistor including a seventh terminal and an eighth terminal, the seventh terminal being connected to the fourth terminal, the second control terminal is connected to the third terminal, the third control terminal is connected to one of the plurality of scanning lines, and the sixth terminal is connected to one of the plurality of data lines.

With this, the threshold voltage of the first transistor is compensated for a change caused by manufacturing dispersion. As a result, since the luminance gradations of the electro-optical elements can be precisely controlled, the display quality of the electro-optical device can be improved as compared with a conventional electro-optical device.

In the electro-optical device, the electro-optical elements may be, for example, organic EL elements.

An electro-optical device according to the present invention can include a plurality of scanning lines, a plurality of data lines, a plurality of power lines, and a plurality of unit circuits having electro-optical elements. Each of the plurality of unit circuits can include a first switching transistor of which the conduction state is controlled according to a scanning signal sent through one corresponding scanning line of the plurality of scanning lines. The device can further include a holding element for accumulating a data signal sent through one data line of the plurality of data lines and the first switching transistor, as a charge, a driving transistor of which the conduction state is set according to the amount of the charge accumulated by the holding element, for supplying current having a current level according to the conduction state to the electro-optical elements, and an adjustment transistor for setting a control terminal of the driving transistor to a predetermined potential prior to the transfer of the data signal to the holding element.

With this, the threshold voltage of the driving transistor is compensated for a change caused by manufacturing dispersion. As a result, since the luminance gradations of the electro-optical elements can be precisely controlled, the display quality of the electro-optical device can be improved as compared with a conventional electro-optical device.

In the electro-optical device, each of the plurality of unit circuits includes a second switching transistor for controlling the electronic connection or the electronic disconnection between the adjustment transistor and the predetermined potential.

With this, the threshold voltage of the first transistor can be compensated by on/off control of the second switching transistor.

In the electro-optical device, the electro-optical elements are, for example, organic EL elements.

A driving method for an electro-optical device according to the present invention is a driving method for an electro-optical device which can include a plurality of scanning lines, a plurality of data lines, a plurality of power lines, and a plurality of unit circuits including a first transistor including a first terminal, a second terminal, and a first control terminal, a second transistor including a third terminal and a fourth terminal, the third terminal being connected to the first control terminal, and a capacitive element including a first electrode and a second electrode, the first electrode being connected to the first control terminal, and the driving method includes a first step of electronically connecting the fourth terminal to a predetermined potential and of setting the first control terminal to a first potential, and a second step of, after a scanning signal is sent through the plurality of scanning lines to a third transistor of which one end is connected to the second electrode to turn on the third transistor, and when the fourth terminal is electronically disconnected from the predetermined potential, applying the voltage corresponding to a data signal from the plurality of data lines to the second electrode through the third transistor to change the potential of the second electrode from a second potential to a third potential to change the potential of the first control terminal from the first potential.

With this, the electro-optical device which compensates the threshold voltage of the first transistor can be driven.

The potential of the second electrode of the capacitive element is set to the second potential while at least the first step is being performed.

In the driving method for the electro-optical device, it is preferred that the first step be performed when the potential of the second electrode of the capacitive element is set to the second potential.

An electronic apparatus according to the present invention can be characterized by having mounted thereon the electronic circuit. Since the electronic apparatus is including the electronic circuit, precise current control can be performed.

A second electronic apparatus according to the present invention can be characterized by having mounted thereon the electro-optical device. With this, the electronic apparatus has a good-display-quality display unit.

BRIEF DESCRIPTION OF THE DRAWINGS

The invention will be described with reference to the above embodiments, wherein like numerals reference like elements, and wherein.

DETAILED DESCRIPTION OF PREFERRED EMBODIMENTS

Figure 1:
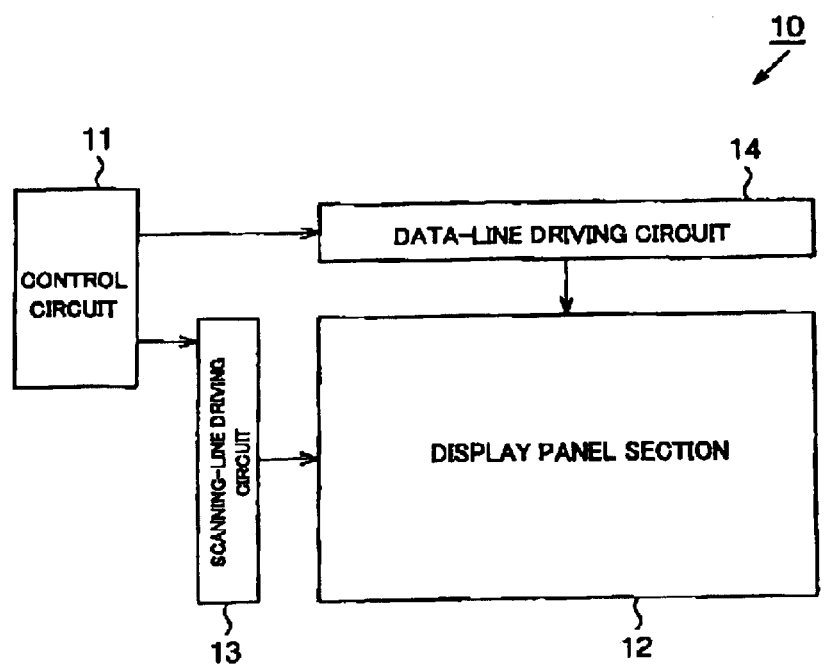
FIG. 1 is a block circuit diagram showing the circuit structure of an organic EL display according to a first embodiment.
Figure 2:
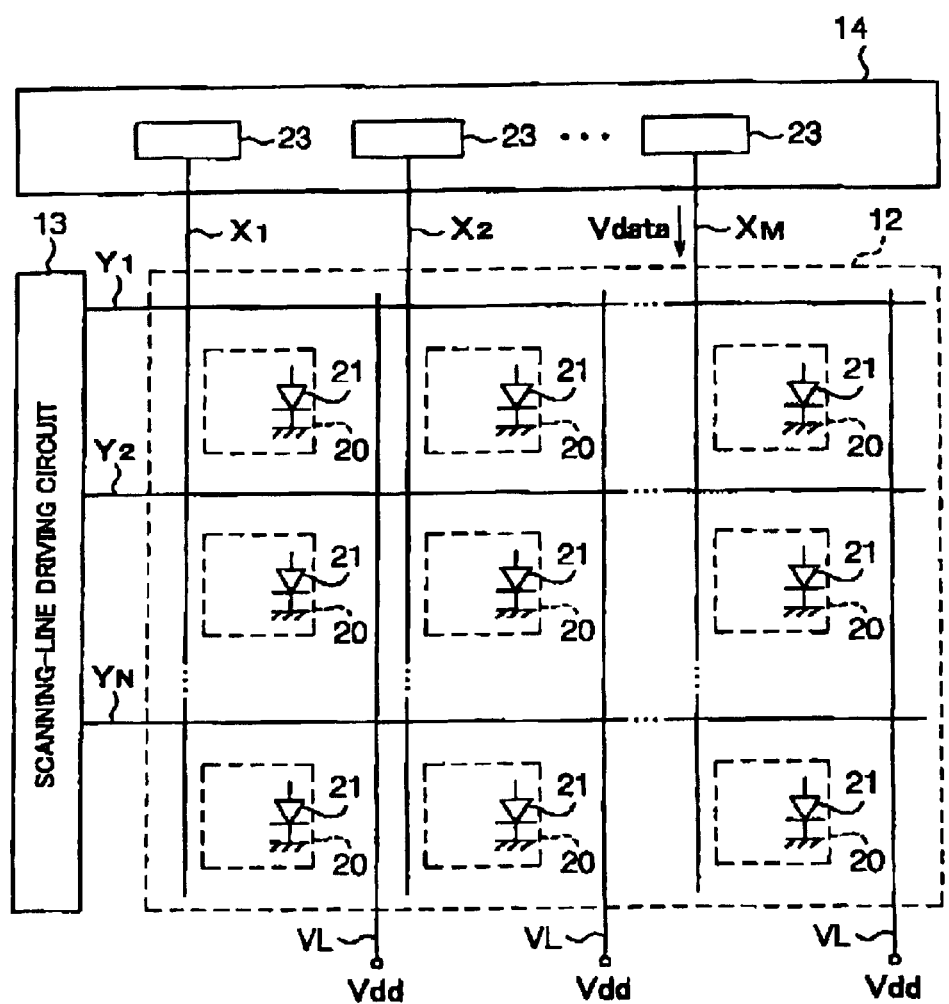
FIG. 2 is a block circuit diagram showing the internal circuit structure of a display panel section and a data-line driving circuit.
Figure 3:
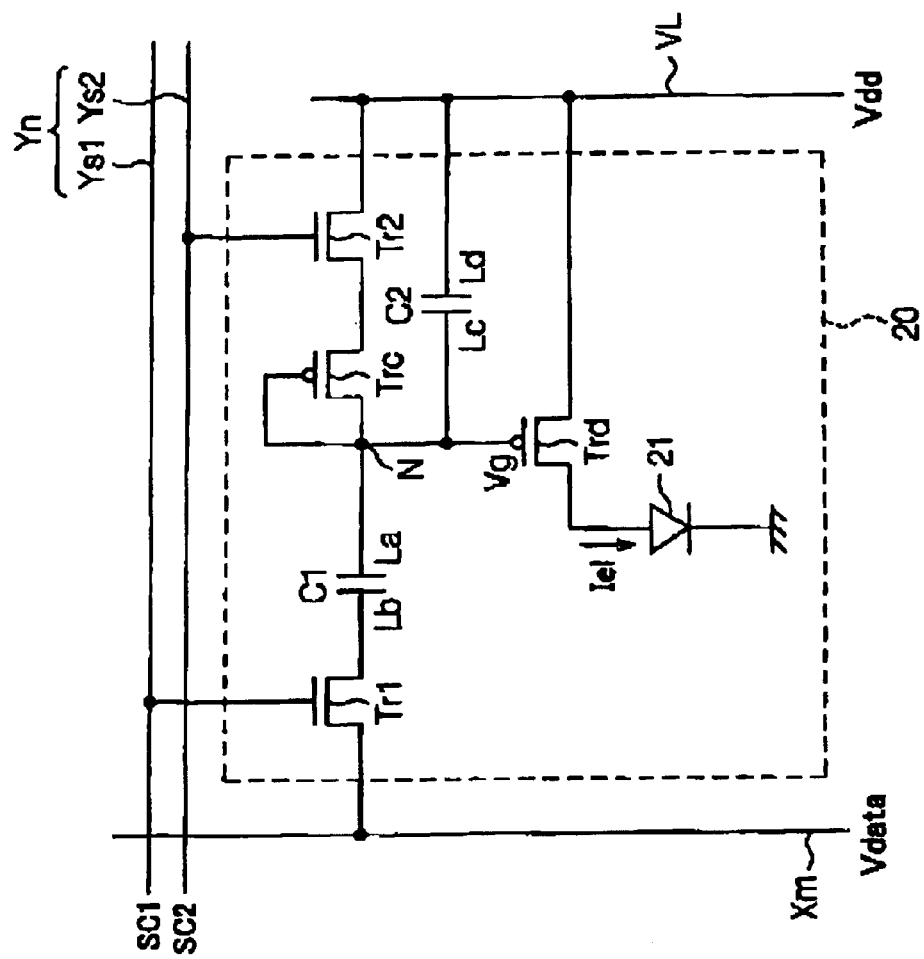
FIG. 3 is a circuit diagram of a pixel circuit according to the first embodiment.
Figure 4:
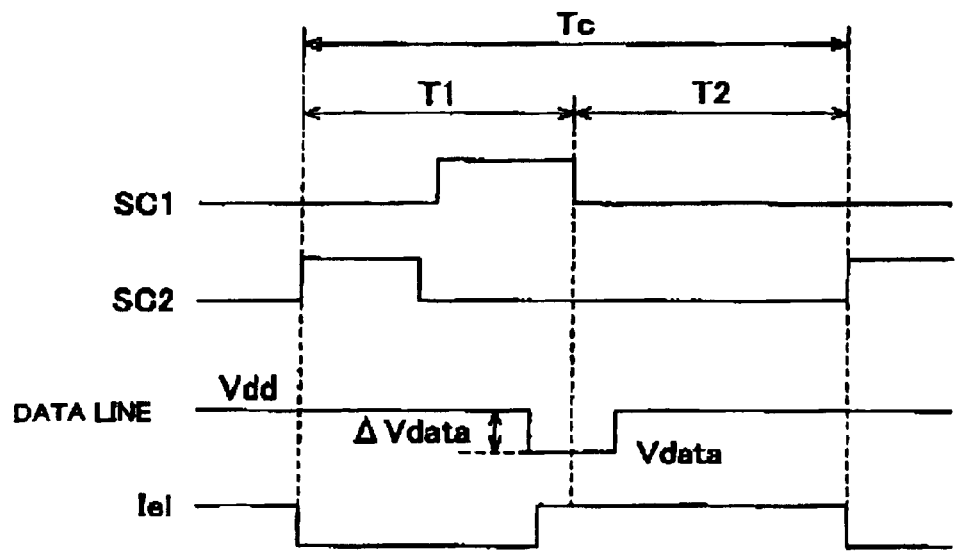
FIG. 4 is a timing chart showing the operation of the pixel circuit according to the first embodiment.

An organic EL display will be taken as an example of an electro-optical device according to an embodiment of the present invention and described by referring to FIG. 1 to FIG. 4. FIG. 1 shows the structure of the control block of the organic EL display. FIG. 2 is a block circuit diagram showing the internal circuit structure of a display panel section and a data-line driving circuit. FIG. 3 is a circuit diagram of a pixel circuit. FIG. 4 is a timing chart showing a driving method for the pixel circuit.

As shown in FIG. 1, the organic EL display 10 can include a control circuit 11, the display panel section 12, a scanning-line driving circuit 13, and the data-line driving circuit 14. The control circuit 11, the scanning-line driving circuit 13, and the data-line driving circuit 14 of the organic EL display 10 may be structured by independent electronic components. For example, each of the control circuit 11, the scanning-line driving circuit 13, and the data-line driving circuit 14 may be structured by a one-chip semiconductor integrated-circuit device. The whole or a part of the control circuit 11, the scanning-line driving circuit 13, and the data-line driving circuit 14 may be structured by a programmable IC chip where their functions are implemented by a program written into the IC chip in a software manner.

The control circuit 11 generates a scanning control signal and a data control signal both used for displaying an image on the display panel section 12 according to the image data sent from an external device not shown. The control circuit 11 outputs the scanning control signal to the scanning-line driving circuit 13, and outputs the data control signal to the data-line control circuit 14.

As shown in FIG. 2, the display panel section 12 has a plurality of pixel circuits 20 serving as electronic circuits or unit circuits, disposed at the positions corresponding to the intersections of M data lines Xm (m=1–M, m is an integer) extending in a column direction and N scanning lines Yn (n=1–N, n is an integer) extending in a row direction. In other words, the plurality of pixel circuits 20 are connected to the data lines Xm extending in the column direction and the scanning lines Yn extending in the row direction, and are arranged in a matrix manner. Each scanning line Yn is formed of a first sub-scanning line Ys1 and a second sub-scanning line Ys2 (see FIG. 3), described later.

The pixel circuit 20 has an organic EL element 21 serving as an electronic element or electro-optical element, as shown in FIG. 2. The pixel circuit 20 is also connected to a power line VL extending in the column direction, and a driving voltage Vdd serving as a power potential is sent to the pixel circuit 20 through the power line VL. In the present invention, a transistor, described in greater detail below, disposed in the pixel circuit 20 can be a thin-film transistor (TFT). The transistor is not limited to a TFT. It may be, for example, a MOS transistor.

The scanning-line driving circuit 13 selects one scanning line from the plurality of scaling lines Yn disposed in the display panel section 12, according to the scanning control signal output from the control circuit 11, and outputs a scanning signal to the selected scanning line.

The data-line driving circuit 14 can include a plurality of single-line drivers 23, as shown in FIG. 2. The single-line drivers 23 are connected to the data lines Xm disposed in the display panel section 12.

More specifically, the data-line driving circuit 14 generates a data voltage Vdata serving as a data signal according to the data control signal output from the control circuit 11. The generated data voltage Vdata is sent to the pixel circuits 20 through the data lines Xm. The internal states of the pixel circuits 20 are set according to the data voltage Vdata to control driving current Ie1 (see FIG. 3) flowing into the organic EL elements 21. The data-line driving circuit 14 also sends a driving voltage Vdd to the pixel circuits 20 in a data writing period T1, described in greater detail below, before the data voltage Vdata.

The pixel circuits 20 constituting the organic EL display 10 structured in this way will be described by referring to FIG. 3.

The pixel circuit 20 is including a driving transistor Trd and an adjustment transistor Trc, as shown in FIG. 3. The pixel circuit 20 is also including a first switching transistor Tr1 and a second switching transistor Tr2. The pixel circuit 20 is further including a coupling capacitor C1 and a holding capacitor C2 serving as capacitive elements or holding element.

The driving transistor Trd and the adjustment transistor Trc have p-type (p-channel) conductivity. The first and second switching transistors Tr1 and Tr2 have n-type (n-channel) conductivity.

The drain of the driving transistor Trd is connected to the anode of the organic EL element 21. The cathode of the organic EL element is grounded. The source of the driving transistor Trd is connected to the power line VL. The gate of the driving transistor Trd is connected to the coupling capacitor C1, the holding capacitor C2, and the adjustment transistor Trc. The coupling capacitor C1 has a capacitance of Ca, and the holding capacitor C2 has a capacitance of Cb.

More specifically, a first electrode La of the coupling capacitor C1 is connected to the gate of the driving transistor Trd, and a second electrode Lb thereof is connected to the drain of the first switching transistor Tr1. A third electrode Lc of the holding capacitor C2 is connected to the gate of the driving transistor Trd, and a fourth electrode Ld thereof is connected to the power line VL.

The gate of the first switching transistor Tr1 is connected to the first sub-scanning line Ys1 serving as a first signal line constituting the scanning line Yn.

The gate of the adjustment transistor Trc is connected to the drain thereof, and also connected to the gate of the driving transistor Trd at a node N. The source of the adjustment transistor Trc is connected to the source of the second switching transistor Tr2. The drain of the second switching transistor Tr2 is connected to the power line VL, and the gate thereof is connected to the second sub-scanning line Ys2 serving as a second signal line constituting the scanning line Yn. The first sub-scanning line Ys1 and the second sub-scanning line Ys2 constitute the scanning line Yn.

The threshold voltage Vth2 of the adjustment transistor Trc is set so as to be almost the same as the threshold voltage Vth1 of the driving transistor Trd. The threshold voltage Vth2 of the adjustment transistor Trc may be set appropriately according to its driving condition. The driving voltage Vdd is set in advance so as to be sufficiently higher than the data voltage Vdata.

The operation of the pixel circuits 20 in the organic EL display 10, structured as described above, will be described next by referring to FIG. 4. In FIG. 4, Tc, T1, and T2 indicate, respectively, a driving period, a data writing period serving as a first step, and a light-emitting period serving as a second step. The driving period Tc is formed of the data writing period T1 and the light-emitting period T2. The driving period Tc indicates a period in which the luminance gradation of the organic EL element 21 is updated once, and is equal to a so-called frame period.

In the data writing period T1, a second scanning signal SC2 for turning on the second switching transistor Tr2 is first applied from the scanning-line driving circuit 13 to the gate of the second switching transistor Tr2 through the second sub-scanning line Ys2. Then, the second switching transistor Tr2 is turned on. As a result, the driving voltage Vdd is sent to the source of the adjustment transistor Trc through the power line VL. At this time, a first scanning signal SC1 for turning off the first switching transistor Tr1 is applied from the scanning-line driving circuit 13 to the gate of the first switching transistor Tr1 through the first sub-scanning line Ys1.

With this, the potential of the source of the adjustment transistor Trc becomes equal to the driving voltage Vdd. A potential Vn1 obtained at the node N is equal to the value (Vn1=Vdd−Vth2) obtained by subtracting the threshold voltage Vth2 of the adjustment transistor Trc from the driving voltage Vdd, and the potential Vn1 is held by the holding capacitor C2 as an initial potential Vc1. The potential Vn1 is also sent to the gate of the driving transistor Trd. As a result, since the threshold voltage Vth2 of the adjustment transistor Trc is almost the same as the threshold voltage Vth1 of the driving transistor Trd, as described before, the threshold voltage Vth1 of the driving transistor Trd is compensated.

Then, the second scanning signal SC2 for turning off the second switching transistor Tr2 is applied from the scanning-line driving circuit 13 to the gate of the second switching transistor Tr2 through the second sub-scanning line Ys2. The second switching transistor Tr2 is turned off. Next, the first scanning signal SC1 for turning on the first switching transistor Tr1 is applied from the scanning-line driving circuit 13 to the gate of the first switching transistor Tr1 through the first sub-scanning line Ys1. The first switching transistor Tr1 is turned on.

The driving voltage Vdd is sent to the pixel circuit 20 through the data line Xm. Then, immediately, the data voltage Vdata is sent from the single-line driver 23 of the data-line driving circuit 14 through the data line Xm.

With this, the initial potential Vc1 is changed to the value indicated by the following expression with the use of the capacitance Ca of the coupling capacitor C1 and the capacitance Cb of the holding capacitor C2.

$Vc1 = Vdd - Vth2 + Ca/(Ca+Cb) \cdot \Delta Vdata$

ΔVdata indicates the potential difference (=Vdd−Vdata) between the driving voltage Vdd and the data voltage Vdata. And, this value, Vdd−Vth2+Ca/(Ca+Cb)·ΔVdata, is sent to the gate of the driving transistor Trd as the final potential Vc2.

The conduction state of the driving transistor Trd is determined according to the final potential Vc2, and the driving current Ie1 determined according to the conduction state flows into the organic EL element 21. The current Ie1 is determined by the following equation when Vgs indicates the voltage difference between the gate voltage and the source voltage of the driving transistor Trd.

$Ie1 = (1/2)\beta(-Vgs-Vth1)^2$

In the equation, β indicates a gain coefficient. The gain coefficient β is obtained by β=(μAW/L), where μ indicates carrier mobility, A indicates a gate capacitance, W indicates a channel width, and L indicate a channel length. The gate voltage Vg of the driving transistor Trd is equal to the final potential Vc2. In other words, the voltage difference Vgs between the gate voltage and the source voltage of the driving transistor Trd can be expressed by the following equation.

$Vgs = Vdd - [Vdd - Vth2 + Ca/(Ca+Cb) \cdot \Delta Vdata]$

Therefore, the driving current Ie1 of the driving transistor Trd is expressed by the following equation.

$Ie1 = (1/2)\beta[Vth2 - Ca/(Ca+Cb) \cdot \Delta Vdata - Vth1]^2$

In the equation, since the threshold voltage Vth2 of the adjustment transistor Trc is set, as described before, to be almost the same as the threshold voltage Vth1 of the driving transistor Trd, the driving current Ie1 can be expressed by the following equation.

$$Ie1 = (1/2)\beta[Vth2 - Ca/(Ca+Cb) \cdot \Delta Vdata - Vth1]^2$$
$$= (1/2)\beta[Ca/(Ca+Cb) \cdot \Delta Vdata]^2$$

Therefore, as indicated by the above equation, the driving current Ie1 does not depend on the threshold voltage Vth1 of the driving transistor Trd, and has the magnitude corresponding to the data voltage Vdata. This driving current Ie1 flows into the organic EL element 21, and the organic EL element 21 emits light.

Next, after the data writing period T1 is finished, the first scanning signal SC1 for turning off the first switching transistor Tr1 is applied from the scanning-line driving circuit 13 to the gate of the first switching transistor Tr1 through the first sub-scanning line Ys1 in the light-emitting period T2. The first switching transistor Tr1 is turned off.

In this light-emitting period T2, the driving current Ie1 corresponding to the conduction state of the driving transistor Trd, determined correspondingly to the final potential Vc2 is sent to the organic EL element 21.

With the above conditions, even if the threshold voltage Vth1 of the driving transistor Trd in each pixel circuit 20 differs due to dispersion in manufacturing, the driving current Ie1 is determined only by the data voltage Vdata. Therefore, the luminance gradation of the organic EL element 21 is precisely controlled according to the data voltage Vdata. As a result, the organic EL display 10 has a good display quality.

The following advantage is obtained with the organic EL display 10 and the pixel circuits 20 according to the present embodiment.

In the present embodiment, the pixel circuit 20 can be formed of the driving transistor Trd, the first and second switching transistors Tr1 and Tr2, the adjustment transistor Trc, the coupling capacitor C1, and the holding capacitor C2. The threshold voltage Vth2 of the adjustment transistor Trc, for generating the compensation voltage for compensating for the threshold voltage Vth1 of the driving transistor Trd is applied to the gate of the driving transistor Trd. With this, the threshold voltage Vth2 of the driving transistor Trd is compensated. Therefore, since the dispersion of the threshold voltages Vth1 of the driving transistors Trd in the pixel circuits 20 can be reduced, the driving current Ie1 corresponding to the data voltage Vdata sent from the data-line driving circuit 14 through the data lines Xm can be precisely controlled. Therefore, the luminance graduation of the organic EL elements 21 can be precisely controlled according to the data voltage Vdata. As a result, the organic EL display 10 has a good display quality.

In the above embodiment, the driving transistor Trd, the first and second switching transistors Tr1 and Tr2, and the adjustment transistor Trc are a p-type transistor, an n-type transistor, an n-type transistor, and a p-type transistor, respectively. However, it should be understood that their conductivity types are not limited to this case. Any conductivity-type transistors can be used if appropriate. For example, n-type transistors can be used as the driving transistor Trd and the adjustment transistor Trc. Transistors having different conductivity types can be used as the first and second switching transistors Tr1 and Tr2. In this case, when the gates of the first and second switching transistors Tr1 and Tr2 are connected to a common signal line, such as a scanning line, and are operated complementarily, an area required for wiring can also be reduced.

Applications of the organic EL display 10 serving as an electro-optical device, described in the first embodiment, to electronic apparatus will be described by referring to FIG. 5 and FIG. 6. The organic EL display 10 can be applied to various electronic appratuss, such as mobile personal computers, portable telephones, and digital cameras.

Figure 5:
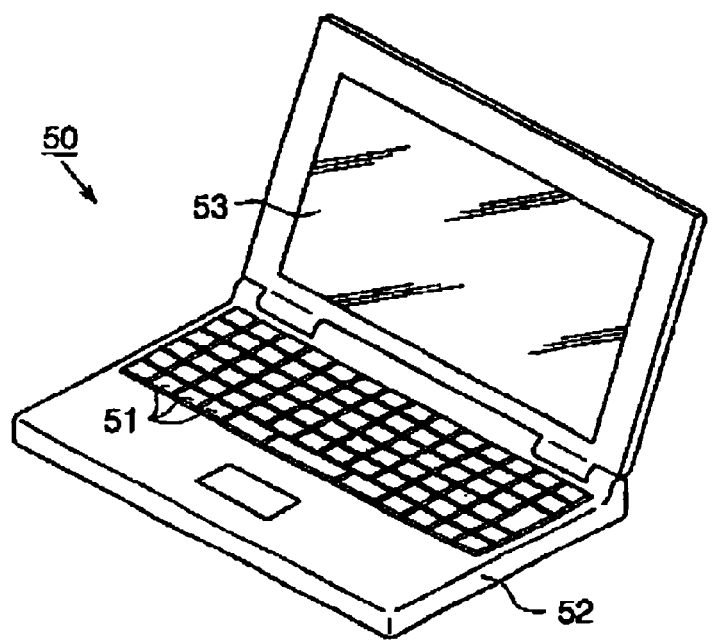
FIG. 5 is a perspective view showing the structure of a mobile personal computer used for describing a second embodiment.

FIG. 5 is a perspective view showing the structure of a mobile personal computer. In FIG. 5, the personal computer 50 is including a body section 52 having a keyboard 51, and a display unit 53 which uses the organic EL display 10. Also in this case, the display unit 53, which uses the organic EL display 10, has the same advantage as in the first embodiment. As a result, the mobile personal computer 50 has a good display quality with the organic EL display 10.

Figure 6:
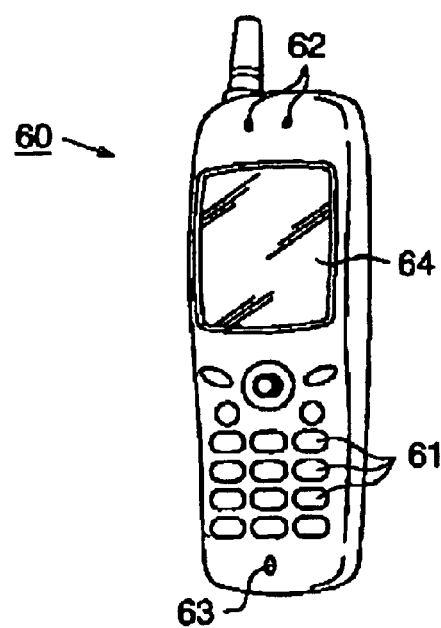
FIG. 6 is a perspective view showing the structure of a mobile telephone used for describing the second embodiment.

FIG. 6 is a perspective view of showing the structure of a portable telephone. In FIG. 6, the portable telephone 60 is including a plurality of operation buttons 61, a receiver 62, a transmitter 63, and a display unit 64 which uses the organic EL display 10. Also in this case, the display unit 64, which uses the organic EL display 10, has the same advantage as in the first embodiment. As a result, the portable telephone 60 has a good display quality with the organic EL display 10.

It should be understood that present invention is not limited to the above embodiments. Various embodiments can be possible such as those described below.

In the above embodiments, the present invention is embodied in a pixel circuit having an organic EL element, serving as a unit circuit. The present invention may be embodied in a unit circuit which drives one of various electro-optical elements, such as liquid-crystal elements, electro-phoresis elements, electron-emission elements, inorganic EL elements, LEDs, and FEDs. The present invention may be embodied in storage devicees such as RAMs.

In the above embodiments, the organic EL displays have pixel circuits equipped with one-color organic EL elements. The present invention can also be applied to an EL display in which organic EL elements which emit light of three colors, red, green, and blue, or more colors are provided for pixel circuits for the colors.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

What is claimed is:

1. An electronic circuit, comprising:
a first transistor including a first terminal, a second terminal, and a first control terminal;
a second transistor including a third terminal, a fourth terminal, and a second control terminal, the third terminal being coupled to the first control terminal;
a capacitive element including a first electrode and a second electrode, the first electrode being coupled to the first control terminal; and
a third transistor including a fifth terminal and a sixth terminal, the fifth terminal being coupled to the second electrode, the second control terminal being coupled to the third terminal.

2. The electronic circuit according to claim 1,
further comprising a fourth transistor including a seventh terminal and an eighth terminal, the seventh terminal being coupled to the fourth terminal.

3. The electronic circuit according to claim 1,
the first terminal being coupled to an electronic element.

4. The electronic circuit according to claim 3,
the electronic element being a current-driven element.

5. An electronic circuit, comprising:
a plurality of first signal lines;
a plurality of power lines; and
a plurality of unit circuits, each of the plurality of unit circuits further comprising:
a first transistor including a first terminal, a second terminal, and a first control terminal;
a second transistor including a third terminal, a fourth terminal, and a second control terminal, the third terminal being coupled to the first control terminal;
a capacitive element including a first electrode and a second electrode, the first electrode being counled to the first control terminal; and
a third transistor including a fifth terminal, a sixth terminal, and a third control terminal, the fifth terminal being coupled to the second electrode,
the second control terminal being coupled to the third terminal, and
the third control terminal being coupled to a respective first signal line of the plurality of first signal lines.

6. The electronic circuit according to claim 5,
further comprising a plurality of second signal lines,
each of the plurality of unit circuits further including a fourth transistor including a seventh terminal, an eighth terminal, and a fourth control terminal,
the seventh terminal being counled to the fourth terminal, and
the fourth control terminal being coupled to a respective second signal line of the plurality of second signal lines.

7. The electronic circuit according to claim 5,
the first terminal being coupled to an electronic element.

8. The electronic circuit according to claim 7,
the electronic element being a current-driven element.

9. An electronic circuit, comprising:
a holding element that holds a signal as a charge;
a first switching transistor that controls the transfer of the signal to the holding element;
a driving transistor of which a conduction state is set according to the charge held by the holding element; and an adjustment transistor that sets a control terminal of the driving transistor to a predetermined potential prior to the transfer of the signal to the holding element.

10. The electronic circuit according to claim 9,
further comprising a second switching transistor that controls the electronic connection or the electronic disconnection between the adjustment transistor and the predetermined potential.

11. The electronic circuit according to claim 9,
the driving transistor being coupled to an electronic element.

12. The electronic circuit according to claim 11,
the electronic element being a current-driven element.

13. A driving method for an electronic circuit comprising:
a first transistor including a first terminal, a second terminal, and a first control terminal;
a second transistor including a third terminal and a fourth terminal, the third terminal being coupled to the first control terminal; and
a capacitive element including a first electrode and a second electrode, the first electrode being coupled to the first control terminal,
the driving method comprising:
electronically connecting the fourth terminal to a predetermined potential for setting the first control terminal to a first potential; and
when the fourth terminal is electronically disconnected from the predetermined potential, changing the potential of the second electrode of the capacitive element from a second potential to a third potential to change the potential of the first control terminal from the first potential.

14. The method for the electronic circuit according to claim 13,
the potential of the second electrode being set to the second potential while at least the fourth terminal is electronically connected to a predetermined potential is being performed.

15. An electro-optical device, comprising:
a plurality of scanning lines;
a plurality of data lines;
a plurality of power lines; and
a plurality of unit circuits having electro-optical elements,
each of the plurality of unit circuits comprises:
a first transistor including a first terminal, a second terminal, and a first control terminal;
an electro-optical element coupled to the first terminal;
a second transistor including a third terminal, a fourth terminal, and a second control terminal, the third terminal being coupled to the first control terminal;
a capacitive element including a first electrode and a second electrode, the first electrode being coupled to the first control terminal;
a third transistor including a fifth terminal, a sixth terminal, and a third control terminal, the fifth terminal being coupled to the second electrode; and
a fourth transistor including a seventh terminal and an eighth terminal, the seventh terminal being coupled to the fourth terminal,
the second control terminal is coupled to the third terminal,
the third control terminal is coupled to one of the plurality of scanning lines, and
the sixth terminal is coupled to one of the plurality of data lines.

16. The electro-optical device according to claim 15, the electro-optical element being an organic EL element.

17. An electro-optical device comprising a plurality of scanning lines, a plurality of data lines, a plurality of power lines, and a plurality of unit circuits, each of the plurality of unit circuits including:
an electro-optical element;
a first switching transistor of which a conduction state is controlled according to a scanning signal supplied through one scanning line of the plurality of scanning lines;
a holding element that accumulates a data signal supplied through one data line of the plurality of data lines and the first switching transistor, as a charge;
a driving transistor of which a conduction state is set according to an amount of the charge accumulated by the holding element, and supplies a current level according to the conduction state to the electro-optical elements; and
an adjustment transistor that sets a control terminal of the driving transistor to a predetermined potential prior to the supply of the data signal to the holding element.

18. The electro-optical device according to claim 17,
each of the plurality of unit circuits comprises a second switching transistor that controls the electronic connection or the electronic disconnection between the adjustment transistor and the predetermined potential.

19. The electro-optical device according to claim 17,
the electro-optical elements being organic EL elements.

20. A driving method for an electro-optical device including a plurality of scanning lines, a plurality of data lines, a plurality of power lines, and a plurality of unit circuits, each of which includes:
a first transistor having a first terminal, a second terminal, and a first control terminal;
a second transistor having a third terminal and a fourth terminal, the third terminal being coupled to the first control terminal; and
a capacitive element including a first electrode and a second electrode, the first electrode being coupled to the first control terminal,
the driving method comprising:
electronically connecting the fourth terminal to a predetermined potential and of setting the first control terminal to a first potential;
after a scanning signal is sent through one scanning line of the plurality of scanning lines to a third transistor of which one end is coupled to the second electrode to turn on the third transistor, and
when the fourth terminal is electronically disconnected from the predetermined potential, applying the voltage corresponding to a data signal from one data line of the plurality of data lines to the second electrode through the third transistor to change the potential of the second electrode from a second potential to a third potential to change the potential of the first control terminal from the first potential.

21. The driving method for the electro-optical device according to claim 20,
the potential of the second electrode of the capacitive element being set to the second potential while at least the coupling of the fourth terminal to a predetermined potential is being performed.

22. The electronic apparatus having mounted thereon an electronic circuit according to claim 1.

23. The electronic apparatus having mounted thereon an electro-optical device according to claim 15.

* * * * *